US011569314B2

(12) United States Patent
Yang et al.

(10) Patent No.: US 11,569,314 B2
(45) Date of Patent: Jan. 31, 2023

(54) ORGANIC LIGHT-EMITTING DISPLAY APPARATUS AND LIFT-OFF PROCESS FOR MANUFACTURING THE SAME

(71) Applicant: Samsung Display Co., Ltd., Yongin-si (KR)

(72) Inventors: Yonghoon Yang, Yongin-si (KR); Minsuk Ko, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 197 days.

(21) Appl. No.: 17/031,813

(22) Filed: Sep. 24, 2020

(65) Prior Publication Data

US 2021/0167146 A1 Jun. 3, 2021

(30) Foreign Application Priority Data

Dec. 3, 2019 (KR) .................. 10-2019-0159353

(51) Int. Cl.
*H01L 27/32* (2006.01)
*H01L 51/52* (2006.01)
(Continued)

(52) U.S. Cl.
CPC ...... *H01L 27/3246* (2013.01); *H01L 27/3206* (2013.01); *H01L 27/3248* (2013.01);
(Continued)

(58) Field of Classification Search
CPC ............. H01L 27/3246; H01L 27/3206; H01L 27/3248; H01L 27/3211; H01L 51/0016;
(Continued)

(56) References Cited

U.S. PATENT DOCUMENTS 8,441,178 B2 5/2013 Choi
9,899,636 B2 2/2018 Defranco et al.
(Continued)

FOREIGN PATENT DOCUMENTS

KR 10-2009-0021443 A 3/2009
KR 10-1373435 B1 3/2014
(Continued)

*Primary Examiner* — Hoai V Pham
(74) *Attorney, Agent, or Firm* — Lewis Roca Rothgerber Christie LLP

(57) ABSTRACT

An organic light-emitting display apparatus includes: first and second pixel electrodes on a substrate, and spaced from each other; a pixel-defining film surrounding edges of the first and second pixel electrodes; a first intermediate layer on the first pixel electrode; a second intermediate layer on the second pixel electrode, spaced from the first intermediate layer; a first counter electrode on the first intermediate layer; a second counter electrode on the second intermediate layer, spaced from the first counter electrode; a first passivation layer on the first counter electrode; a second passivation layer on the second counter electrode, spaced from the first passivation layer; a first bank around the first passivation layer and protruding from the pixel-defining film to extend in a direction away from the substrate; and a second bank around the second passivation layer and protruding from the pixel-defining film to extend in the direction away from the substrate.

15 Claims, 20 Drawing Sheets

(51) Int. Cl.
   *H01L 51/56*     (2006.01)
   *H01L 51/00*     (2006.01)
(52) U.S. Cl.
   CPC ...... *H01L 51/0016* (2013.01); *H01L 51/0018* (2013.01); *H01L 51/5209* (2013.01); *H01L 51/5225* (2013.01); *H01L 51/5253* (2013.01); *H01L 51/56* (2013.01)
(58) Field of Classification Search
   CPC ............ H01L 51/0018; H01L 51/5209; H01L 51/5225; H01L 51/5253; H01L 51/56; H01L 51/5237; H01L 2251/56
   USPC ........................................................ 257/40
   See application file for complete search history.

(56) References Cited

U.S. PATENT DOCUMENTS

| | | | |
|---|---|---|---|
| 2010/0238142 A1* | 9/2010 | Chuman | H01L 27/3274 345/204 |
| 2017/0365812 A1 | 12/2017 | Choung et al. | |
| 2018/0366524 A1 | 12/2018 | Bang et al. | |
| 2020/0119114 A1* | 4/2020 | Kim | H01L 51/525 |
| 2020/0161394 A1* | 5/2020 | Jeon | H01L 51/0011 |
| 2020/0212143 A1* | 7/2020 | Jeong | H01L 51/56 |

FOREIGN PATENT DOCUMENTS

| | | |
|---|---|---|
| KR | 10-1723880 B1 | 4/2017 |
| KR | 10-2017-0048360 A | 5/2017 |

\* cited by examiner

ORGANIC LIGHT-EMITTING DISPLAY APPARATUS AND LIFT-OFF PROCESS FOR MANUFACTURING THE SAME

CROSS-REFERENCE TO RELATED APPLICATION

This application claims priority to and the benefit of Korean Patent Application No. 10-2019-0159353, filed on Dec. 3, 2019, in the Korean Intellectual Property Office, the entire disclosure of which is incorporated by reference herein.

BACKGROUND

1. Field

Aspects of one or more embodiments relate to an organic light-emitting display apparatus and a method of manufacturing the same.

2. Description of Related Art

An organic light-emitting display apparatus includes an organic light-emitting device including a hole injection electrode, an electron injection electrode, and an organic emission layer formed between the hole injection electrode and the electron injection electrode. The organic light-emitting display apparatus is a self-emissive display apparatus that generates light when excitons generated from combinations between holes injected from the hole injection electrode and electrons injected from the electron injection electrode in the organic emission layer drop from an excited state to a ground state.

Although a fine metal mask (FMM) may be used as a technology for depositing an organic emission layer on a substrate, there may be limitations in manufacturing a high-resolution organic light-emitting display apparatus due to a shadow effect of the FMM. Accordingly, there may be a demand for an alternative deposition technology.

The above information disclosed in this Background section is for enhancement of understanding of the background of the present disclosure, and therefore, it may contain information that does not constitute prior art.

SUMMARY

One or more embodiments of the present disclosure are directed to an organic light-emitting display apparatus for reducing defects, and/or for simplifying a process and a method of manufacturing the organic light-emitting display apparatus. However, the aspects and features of the present disclosure described above are provided as examples, and the scope of the present disclosure is not limited thereto.

Additional aspects and features of the present disclosure will be set forth in part in the description which follows and, in part, will be apparent from the description, or may be learned by practicing one or more example embodiments of the present disclosure.

According to one or more example embodiments, an organic light-emitting display apparatus includes: a substrate; first and second pixel electrodes on the substrate, and spaced from each other; a pixel-defining film surrounding edges of the first and second pixel electrodes; a first intermediate layer on the first pixel electrode, and including a first emission layer; a second intermediate layer on the second pixel electrode to be spaced from the first intermediate layer, and including a second emission layer; a first counter electrode on the first intermediate layer; a second counter electrode on the second intermediate layer to be spaced from the first counter electrode; a first passivation layer on the first counter electrode; a second passivation layer on the second counter electrode to be spaced from the first passivation layer; a first bank around the first passivation layer and protruding from the pixel-defining film to extend in a direction away from the substrate; and a second bank around the second passivation layer and protruding from the pixel-defining film to extend in the direction away from the substrate.

In one or more example embodiments, each of the first bank and the second bank may have a closed loop shape.

In one or more example embodiments, each of the first bank and the second bank may include a plurality of open portions.

In one or more example embodiments, an area of the first passivation layer may be greater than an area of the first counter electrode, and an area of the second passivation layer may be greater than an area of the second counter electrode.

In one or more example embodiments, the first passivation layer may cover both a top surface and a side surface of the first counter electrode, and the second passivation layer may cover both a top surface and a side surface of the second counter electrode.

In one or more example embodiments, an area of the first counter electrode may be greater than an area of the first intermediate layer, and an area of the second counter electrode may be greater than an area of the second intermediate layer.

In one or more example embodiments, the first counter electrode may cover both a top surface and a side surface of the first intermediate layer, and the second counter electrode may cover both a top surface and a side surface of the second intermediate layer.

In one or more example embodiments, each of the first and second banks may include a same material as a material of the pixel-defining film.

In one or more example embodiments, a bottom surface of each of the first and second banks may directly contact a top surface of the pixel-defining film.

In one or more example embodiments, the organic light-emitting display apparatus may further include an encapsulation member covering the first and second passivation layers and the first and second banks.

In one or more example embodiments, the encapsulation member may include at least one organic layer including an organic material, and at least one inorganic layer including an inorganic material.

In one or more example embodiments, the at least one inorganic layer may include a first inorganic layer directly contacting the first and second passivation layers, and a second inorganic layer on the at least one organic layer.

In one or more example embodiments, the first emission layer and the second emission layer may emit light of different colors from each other.

In one or more example embodiments, each of the first intermediate layer and the second intermediate layer may further include at least one layer selected from among a hole injection layer, a hole transport layer, an electron transport layer, and an electron injection layer.

In one or more example embodiments, each of the first and second passivation layers may include a nitride-based inorganic material.

According to one or more example embodiments, a method of manufacturing an organic light-emitting display apparatus, includes: forming, on a substrate, a pixel electrode and a pixel-defining film covering an edge of the pixel electrode; forming, on the pixel-defining film, a bank protruding in a direction away from the substrate; sequentially forming a liftoff layer and a photoresist on the pixel electrode, the pixel-defining film, and the bank; forming an opening by patterning the liftoff layer and the photoresist, the opening exposing the pixel-defining film located on a top surface of the pixel electrode and within the bank; sequentially depositing an intermediate layer including an emission layer, a counter electrode, and a passivation layer on the opening and the photoresist; and removing a residue of the photoresist and the liftoff layer.

In one or more example embodiments, a thickness of the bank may be less than a thickness of the liftoff layer.

In one or more example embodiments, an edge of the photoresist may protrude beyond an edge of the liftoff layer at the opening.

In one or more example embodiments, the photoresist may be patterned by using a photolithography process.

In one or more example embodiments, the liftoff layer may include a fluoropolymer.

In one or more example embodiments, the opening may be formed by etching the liftoff layer by using a first solvent including fluorine.

In one or more example embodiments, the residue of the liftoff layer may be removed by using a second solvent including fluorine.

In one or more example embodiments, the passivation layer may be deposited by using a deposition process having better step coverage than a deposition process used for the intermediate layer and the counter electrode.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
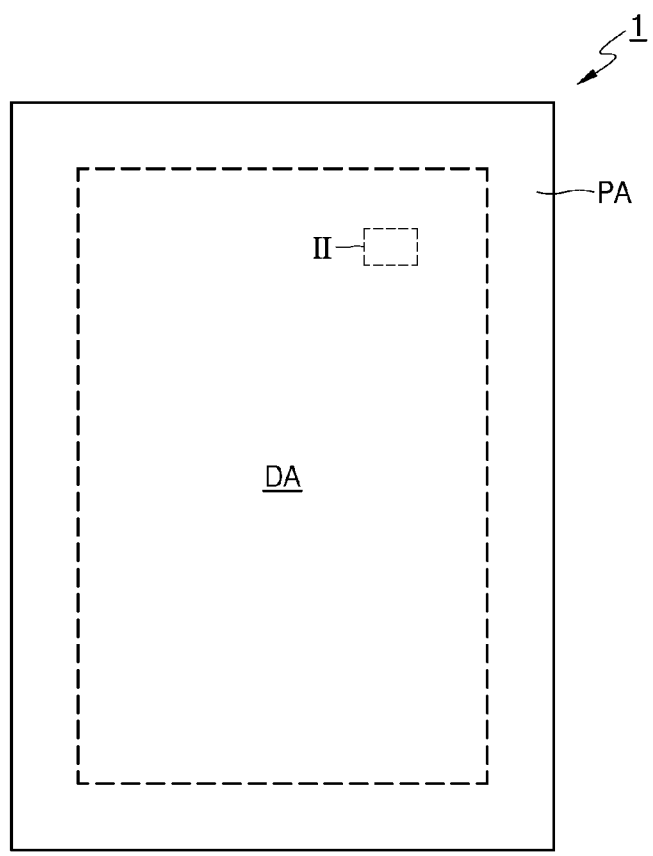
FIG. 1 is a plan view illustrating an organic light-emitting display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when a particular embodiment may be implemented differently, a specific process order may be different from a described one. For example, two processes that are consecutively described may be performed at the same or substantially at the same time, or may be performed in an order opposite to the described order. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, it will be understood that when a layer, region, or element is referred to as being "formed on" another layer, region, or element, it may be directly formed on the other layer, region, or element, or may be indirectly formed on the other layer, region, or element with intervening layers, regions, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, "A and/or B" refers to A or B, or A and B. Expressions such as "at least one of," when preceding a list of elements, modify the entire list of elements and do not modify the individual elements of the list. For example, the expression "at least one of a, b, and c" may indicate only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
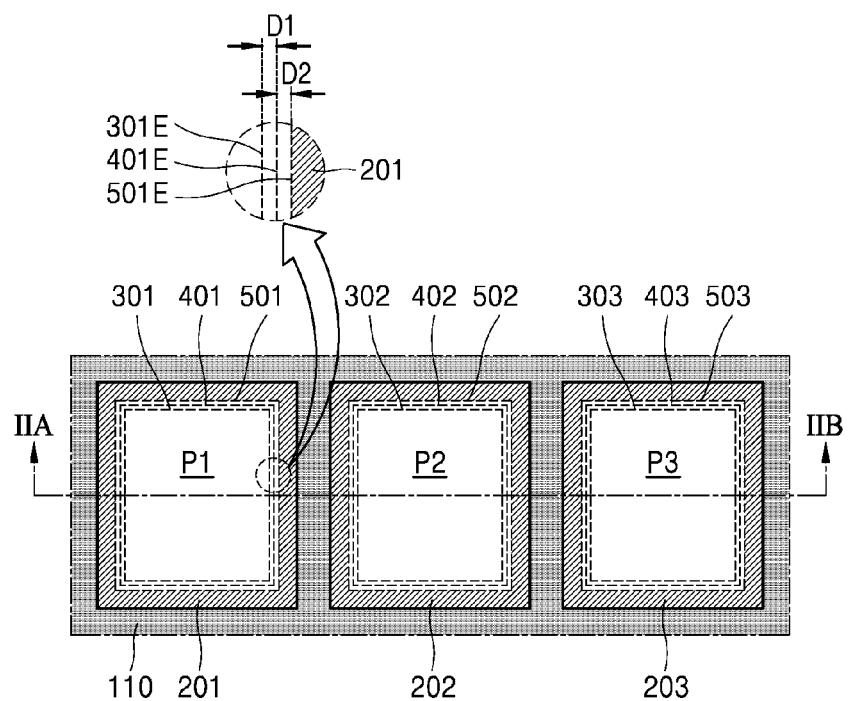
FIG. 2 is a plan view illustrating an enlarged portion corresponding to the region II of FIG. 1.
Figure 3:
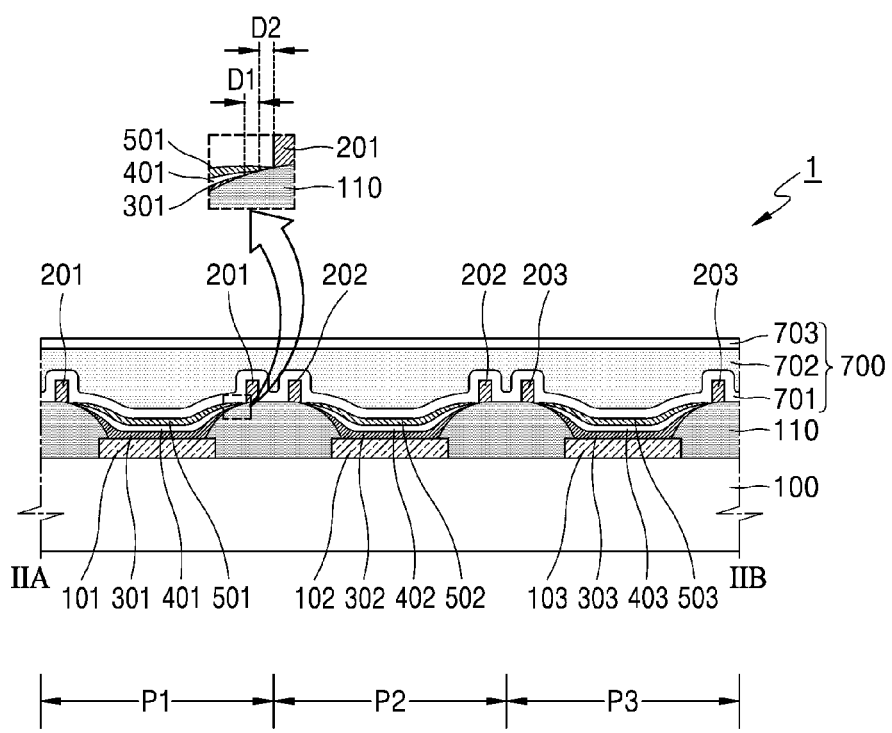
FIG. 3 is a cross-sectional view taken along the line IIA-IIB of FIG. 2.

FIG. 1 is a plan view illustrating an organic light-emitting display apparatus 1 according to an embodiment. FIG. 2 is a plan view illustrating an enlarged portion corresponding to the region II of FIG. 1. FIG. 3 is a cross-sectional view taken along the line IIA-IIB of FIG. 2.

Referring to FIGS. 1 through 3, the organic light-emitting display apparatus 1 according to one or more embodiments may include a display area DA and a peripheral area PA located on a substrate 100.

The display area DA may be an area that provides a desired or suitable image (e.g., a predetermined or a certain image) through light emitted by pixels, and the peripheral area PA may be an area that surrounds (e.g., around a periphery of) the display area DA and does not provide an image. Various drivers, for example, such as a scan driver that provides a scan signal to a pixel of the display area DA and a data driver that provides a data signal, and a pad unit (e.g., a pad or a pad circuit) may be provided at (e.g., in or on) the peripheral area PA.

The region II of FIG. 1 corresponds to a unit pixel (e.g., a pixel or a pixel unit) of the organic light-emitting display apparatus 1, which may include first through third sub-pixels P1, P2, and P3. For example, the first sub-pixel P1 may generate red light, the second sub-pixel P2 may generate green light, and the third sub-pixel P3 may generate blue light, and thus, the unit pixel may generate white light (e.g., by combining the red light, the green light, and the blue light). Although three sub-pixels may be located in the unit pixel, the present disclosure is not limited thereto.

In the first through third sub-pixels P1, P2, and P3, a first pixel electrode 101, a second pixel electrode 102, and a third pixel electrode 103 may be located on the substrate 100 to be spaced apart from one another.

A pixel-defining film 110 may define a pixel by having openings through which top surfaces of the first through third pixel electrodes 101, 102, and 103 are exposed. The pixel-defining film 110 may prevent or substantially prevent an electric field from being concentrated on edges of the first through third pixel electrodes 101, 102, and 103 by covering the edges of the first through third pixel electrodes 101, 102, and 103.

Although the first through third sub-pixels P1, P2, and P3 having the same or substantially the same size and the same or substantially the same rectangular shape (e.g., in a plan view) are shown as arranged in FIG. 2, the present disclosure is not limited thereto. For example, in other embodiments, the sizes and/or the shapes of the first through third sub-pixels P1, P2, and P3 may be different from one another, and/or an arrangement of the first through third sub-pixels P1, P2, and P3 may be any of various suitable arrangements, for example, such as a stripe arrangement, a pentile arrangement, and/or the like.

First through third intermediate layers 301, 302, and 303 including first through third emission layers may be located on the first through third pixel electrodes 101, 102, and 103, respectively. First through third counter electrodes 401, 402, and 403 may be located on the first through third intermediate layers 301, 302, and 303, respectively.

The first through third intermediate layers 301, 302, and 303 may be separated (e.g., spaced apart) from one another. In some embodiments, the first intermediate layer 301 may further include at least one of a first hole injection layer, a first hole transport layer, a first electron transport layer, and a first electron injection layer, in addition to the first emission layer. The second intermediate layer 302 may further include at least one of a second hole injection layer, a second hole transport layer, a second electron transport layer, and a second electron injection layer, in addition to the second emission layer. The third intermediate layer 303 may further include at least one of a third hole injection layer, a third hole transport layer, a third electron transport layer, and a third electron injection layer, in addition to the third emission layer. Accordingly, the first through third hole injection layers, the first through third hole transport layers, the first through third electron transport layers, and the first through third electron injection layers located at (e.g., in or on) the first through third sub-pixels P1, P2, and P3, as well as the first through third emission layers, respectively, may be separated (e.g., spaced apart) from one another at (e.g., in or on) the first through third sub-pixels P1, P2, and P3.

The first through third counter electrodes 401, 402, and 403 may be separated (e.g., spaced apart) from one another. In an embodiment, the first through third counter electrodes 401, 402, and 403 may be formed to be wider than (e.g., to have a larger width than that of) the first through third intermediate layers 301, 302, and 303, respectively. The first through third counter electrodes 401, 402, and 403 may cover top surfaces and side surfaces of the first through third intermediate layers 301, 302, and 303, respectively.

For example, an end 401E of the first counter electrode 401 located above the pixel-defining film 110 may be longer by a first width D1 than an end 301E of the first intermediate layer 301, so that the first counter electrode 401 completely covers (e.g., entirely covers) the first intermediate layer 301, thereby preventing or reducing degradation of the first intermediate layer 301, which may be vulnerable to moisture and/or oxygen.

The first through third counter electrodes 401, 402, and 403 may be electrically connected to a common power supply to receive a common power supply voltage, and the first through third pixel electrodes 101, 102, and 103 may receive driving currents from driving thin-film transistors. Accordingly, the first through third emission layers of the first through third intermediate layers 301, 302, and 303 may emit light.

First through third passivation layers 501, 502, and 503 that may be separated (e.g., spaced apart) from one another may be located on the first through third counter electrodes 401, 402, and 403, respectively.

The first through third passivation layers 501, 502, and 503 may be formed by using a material that may be deposited by using chemical vapor deposition (CVD) or atomic layer deposition (ALD), which may have better step coverage than that of physical vapor deposition (PVD). For example, the first through third passivation layers 501, 502, and 503 may include a nitride-based material.

In an embodiment, the first through third passivation layers 501, 502, and 503 may be formed to be wider than (e.g., to have a larger width than that of) the first through third counter electrodes 401, 402, and 403, respectively. The first through third passivation layers 501, 502, and 503 may cover top surfaces and side surfaces of the first through third counter electrodes 401, 402, and 403, respectively.

For example, an end 501E of the first passivation layer 501 located above the pixel-defining film 110 may be longer than the end 401E of the first counter electrode 401 by a second width D2, so that the first passivation layer 501 completely covers (e.g., entirely covers) the first counter electrode 401. Accordingly, during a liftoff process that is a subsequent wet process, damage to the first counter electrode 401 may be prevented or reduced. Further, because the first passivation layer 501 also completely covers (e.g., entirely covers) the first intermediate layer 301, degradation of the first intermediate layer 301, which may be vulnerable to moisture and/or oxygen, may be prevented or substantially prevented.

First through third banks 201, 202, and 203 that are separated (e.g., spaced apart) from one another may be located around (e.g., to surround a periphery of) the first through third passivation layers 501, 502, and 503, respectively.

The first through third banks 201, 202, and 203 may extend in a direction away from the substrate 100 to protrude from the pixel-defining film 110. Bottom surfaces of the first through third banks 201, 202, and 203 may contact (e.g., may directly contact) a top surface of the pixel-defining film 110.

During a process of patterning a space where the first through third intermediate layers 301, 302, and 303, the first through third counter electrodes 401, 402, and 403, and the first through third passivation layers 501, 502, and 503 are deposited by using a liftoff layer and a photoresist, which may be described in more detail below, instead of using a fine metal mask (FMM), undercut lengths of the liftoff layer may be uniformly adjusted and a precise pixel design may be provided.

For example, the first through third banks 201, 202, and 203 may have closed loop shapes as shown in FIG. 2. Because the first through third banks 201, 202, and 203 may be formed to have closed loop shapes surrounding (e.g., around a periphery of) the first through third passivation layers 501, 502, and 503, respectively, the undercut lengths of first through third liftoff layers LOL1, LOL2, and LOL3 (e.g., see FIGS. 6C, 7C, and 8C) may be uniformly adjusted, and first through third deposition spaces C1', C2', and C3' (e.g., see FIGS. 6C, 7C, and 8C) may be stably secured.

Although the end 501E of the first passivation layer 501 is shown in FIG. 2 as ending at an end portion of the first bank 201, the present disclosure is not limited thereto. For example, in some embodiments, the end 501E of the first passivation layer 501 may extend from a bottom (e.g., a bottom surface) of the first bank 201 towards a top surface of the first bank 201 in a direction away from the substrate 100 according to a deposition condition, and may be deposited on a side wall (e.g., a lateral surface) of the first bank 201.

Figure 4:
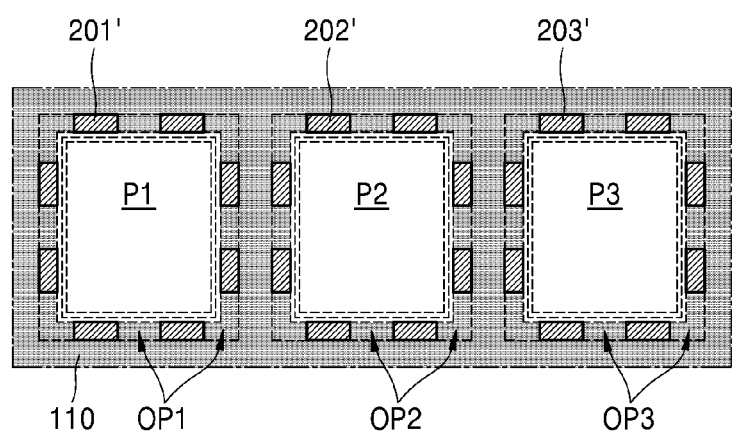
FIG. 4 is a plan view illustrating first through third banks according to an embodiment.

FIG. 4 is a plan view illustrating first through third banks 201', 202', and 203' according to another embodiment. The embodiment shown in FIG. 4 may be different from one or more of those described above in that the first through third banks 201', 202', and 203' may not have closed loop shapes, and may be formed to have first through third open portions OP1, OP2, and OP3, respectively, which may have openings in a direction parallel to or substantially parallel to the substrate 100 (e.g., to a top surface of the substrate 100).

During a process of forming a deposition space and removing a liftoff layer, the first through third open portions OP1, OP2, and OP3 may function as paths through which a developing agent is smoothly penetrated into the liftoff layer. Because the developing agent is smoothly penetrated into the liftoff layer, a residue of the liftoff layer may be cleanly removed, and contamination due to the residue of the liftoff layer may be prevented or substantially prevented.

In some embodiments, an encapsulation member (e.g., an encapsulation layer) 700 (e.g., see FIG. 3) may be further located on the first through third passivation layers 501, 502, and 503. The encapsulation member 700 may include at least one organic layer including an organic material, and at least one inorganic layer including an inorganic material. For example, in some embodiments, the encapsulation member 700 may include a first inorganic layer 701, an organic layer 702, and a second inorganic layer 703.

In some embodiments, the first inorganic layer 701, the organic layer 702, and the second inorganic layer 703 may be sequentially stacked on one another as shown in FIG. 3. However, the present disclosure is not limited thereto. For example, when each of the first through third passivation layers 501, 502, and 503 is formed of an inorganic material, the first inorganic layer 701 may be omitted. In this case, the organic layer 702 may contact (e.g., may directly contact) the first through third passivation layers 501, 502, and 503.

Each of the first inorganic layer 701 and the second inorganic layer 703 may include, for example, aluminum nitride (AlN), aluminum oxide ($Al_2O_3$), titanium nitride (TiN), titanium oxide ($TiO_2$), silicon oxynitride (SiON), silicon nitride (SiNx), or silicon oxide (SiOx).

Because the first inorganic layer 701 may be formed along a shape of a lower structure (e.g., the first through third passivation layers 501, 502, and 503), a top surface of the first inorganic layer 701 may not be flat. In this case, the organic layer 702 may cover the first inorganic layer 701, and may have a sufficient thickness to planarize or substantially planarize a top surface of the organic layer 702 at (e.g., in or on) the display area DA.

The organic layer 702 may include, for example, polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate or polyacrylic acid), or a combination thereof.

The second inorganic layer 703 may cover the organic layer 702, and may be deposited at (e.g., in or on) the peripheral area PA of the organic light-emitting display apparatus 1 to contact (e.g., to directly contact) the first inorganic layer 701, thereby preventing or substantially preventing the organic layer 702 from being exposed to the outside of the organic light-emitting display apparatus 1 (e.g., from being externally exposed).

The encapsulation member 700 may prevent or substantially prevent damage to the organic light-emitting device that may be vulnerable to moisture along with the first through third passivation layers 501, 502, and 503 by preventing or substantially prevented penetration of moisture.

Accordingly, in the organic light-emitting display apparatus 1 according to one or more example embodiments of the present disclosure, the first through third banks 201, 202, and 203 (or the first through third banks 201', 202', and 203') located outside the first through third passivation layers 501, 502, and 503 may protrude in a direction away from the substrate 100, and thus, when the liftoff layer is patterned, an undercut length dispersion of the liftoff layer may be reduced. Accordingly, a precise pixel design may be provided.

Further, in some embodiments, the first through third passivation layers 501, 502, and 503 may completely cover (e.g., may entirely cover) the first through third counter electrodes 401, 402, and 403 by using vapor deposition having excellent step coverage (e.g., improved step coverage), and thus, defects of the organic light-emitting device may be reduced.

A method of manufacturing the organic light-emitting display apparatus 1 according to one or more example embodiments of the present disclosure will be described in more detail with reference to FIGS. 5 through 8E.

Figure 5:
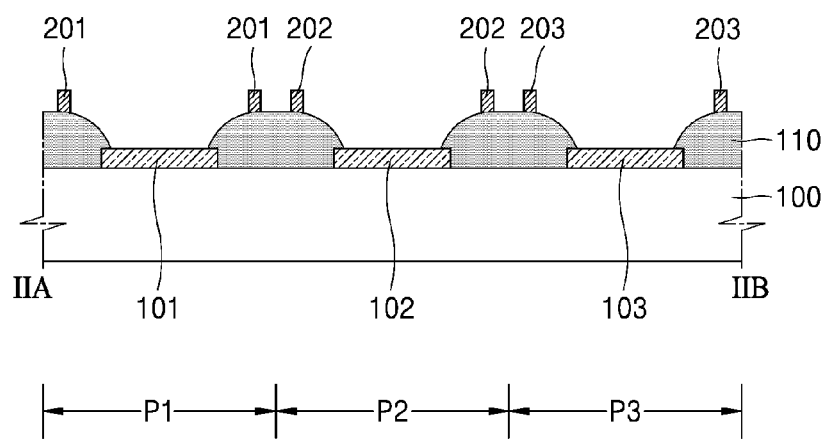
FIG. 5 is a cross-sectional view illustrating a state where first through third pixel electrodes, a pixel-defining film, and first through third banks are formed on a substrate.

FIG. 5 is a cross-sectional view illustrating a state where the first through third pixel electrodes 101, 102, and 103, the pixel-defining film 110, and the first through third banks 201, 202, and 203 are formed on the substrate 100 of the organic light-emitting display apparatus 1 according to one or more example embodiments of the present disclosure. FIGS. 6A through 6E are cross-sectional views illustrating a first unit process of a method of manufacturing the organic light-emitting display apparatus 1 according to one or more example embodiments of the present disclosure. FIGS. 7A through 7E are cross-sectional views illustrating a second unit process of the method of manufacturing the organic light-emitting display apparatus 1 according to one or more example embodiments of the present disclosure. FIGS. 8A through 8E are cross-sectional views illustrating a third unit process of the method of manufacturing the organic light-emitting display apparatus 1 according to one or more example embodiments of the present disclosure.

Referring to FIG. 5, the first pixel electrode 101, the second pixel electrode 102, and the third pixel electrode 103 are formed on the substrate 100.

The substrate 100 may be formed of any of various suitable materials. For example, the substrate 100 may be formed of glass and/or plastic. The plastic may be a material having high heat resistance and high durability, for example, such as polyimide, polyethylene naphthalate, polyethylene terephthalate, polyarylate, polycarbonate, polyetherimide, or polyethersulfone.

In some embodiments, a buffer layer for preventing or substantially preventing penetration of impurity elements, and for forming a flat or substantially flat surface may be further formed on the substrate 100. For example, in this case, the buffer layer may be formed to have a single layer structure or a multi-layered structure by using, for example, silicon nitride and/or silicon oxide.

The first through third pixel electrodes 101, 102, and 103 may be formed by depositing a conductive material layer on the substrate 100 by using, for example, physical vapor deposition (PVD), and then patterning the conductive material layer to be separated.

In some embodiments, the conductive material layer may include a reflective film formed of, for example, magnesium (Mg), aluminum (Al), platinum (Pt), palladium (Pd), gold (Au), nickel (Ni), neodymium (Nd), iridium (Ir), chromium (Cr), or a compound thereof, or a transparent conductive oxide film formed over or under the reflective film. In other embodiments, the conductive material layer may be a thin film including, for example, silver (Ag) or an Ag alloy, or may include a transparent conductive oxide film formed on the thin film. According to the conductive material layer, the first through third pixel electrodes 101, 102, and 103 may be reflective electrodes or light-transmitting electrodes.

An insulating film may be formed on the substrate 100 on which the first through third pixel electrodes 101, 102, and 103 are patterned, and the pixel-defining film 110 may be formed by patterning the insulating film. The pixel-defining film 110 may cover edges of the first through third pixel electrodes 101, 102, and 103.

The pixel-defining film 110 may include, for example, an organic insulating material or an inorganic insulating material. For example, in an embodiment, the pixel-defining film 110 may be an organic insulating film including a general-purpose polymer (e.g., polymethyl methacrylate (PMMA) or polystyrene (PS)), an acrylic polymer, an imide-based polymer, an aryl ether-based polymer, an amide-based polymer, a fluorine-based polymer, a p-xylene-based polymer, a vinyl alcohol-based polymer, or a blend thereof.

The first through third banks 201, 202, and 203 are formed on the pixel-defining film 110 to be spaced apart from one another at (e.g., in or on) the sub-pixels P1, P2, and P3. The first through third banks 201, 202, and 203 may protrude from the pixel-defining film 110 to extend in a direction away from the substrate 100.

The first through third banks 201, 202, and 203 may include the same or substantially the same material as that of the pixel-defining film 110. For example, the first through third banks 201, 202, and 203 may be patterned during the same process as that of the pixel-defining film 110. In this case, the first through third banks 201, 202, and 203 and the pixel-defining film 110 may be concurrently formed (e.g., simultaneously formed) during the same process by using a halftone mask.

In some embodiments, the first through third banks 201, 202, and 203 may be formed to have closed loop shapes, for example, as shown in FIG. 2. In other embodiments, the first through third open portions OP1, OP2, and OP3 may be formed between the first through third banks 201', 202', and 203', for example, as shown in FIG. 4.

The first through third pixel electrodes 101, 102, and 103 may be electrically connected to first through third thin film transistors, respectively. For example, the first through third thin film transistors may be located between the substrate 100 and the first through third pixel electrodes 101, 102, and 103.

Figure 6A:
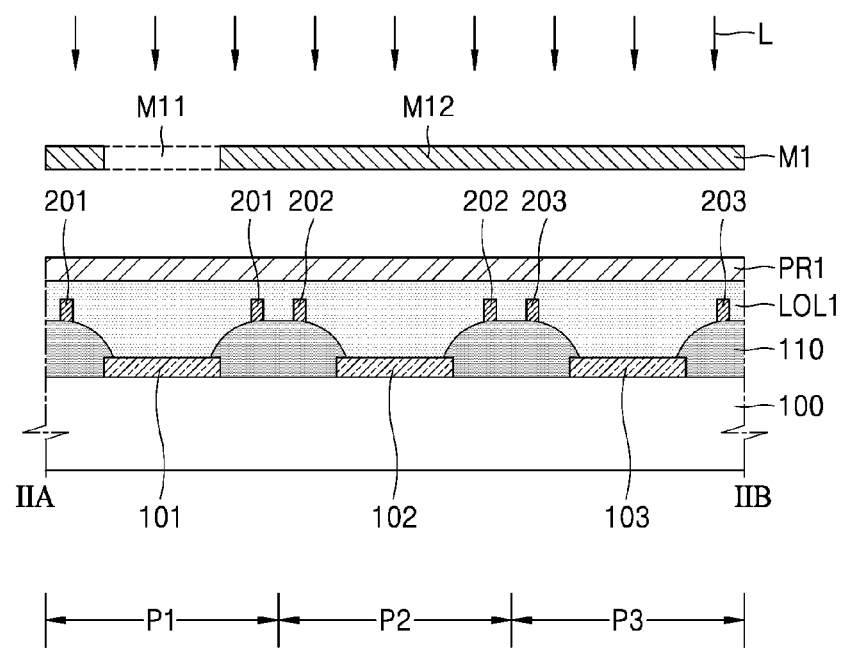
FIGS. 6A-6E are cross-sectional views illustrating a first unit process of a method of manufacturing the organic light-emitting display apparatus.

Referring to FIG. 6A, the first liftoff layer LOL1 and a first photoresist PR1 may be sequentially formed on the resultant structure of FIG. 5.

The first liftoff layer LOL1 may be formed of, for example, a non-photosensitive organic material. For example, in an embodiment, the first liftoff layer LOL1 may include a fluoropolymer. In this case, the fluoropolymer included in the first liftoff layer LOL1 may be a polymer having a fluorine content of, for example, about 20 weight percent (wt %) to about 60 wt %.

For example, in an embodiment, the fluoropolymer may include at least one of polytetrafluoroethylene, polychlorotrifluoroethylene, and polydichlorodifluoroethylene. In another embodiment, the fluoropolymer may include at least one of a copolymer of chlorotrifluoroethylene and dichlorodifluoroethylene, a copolymer of tetrafluoroethylene and perfluoroalkylvinylether, and a copolymer of chlorotrifluoroethylene and perfluoroalkylvinylether.

However, the present disclosure is not limited thereto, and in other embodiments, the first liftoff layer LOL1 may include a non-fluorinated material. The first liftoff layer LOL1 may be formed by using, for example, a coating process, a printing process, a deposition process, or the like.

The first liftoff layer LOL1 may be formed to have a height greater than that of the first through third banks 201, 202, and 203, and thus, in a process of removing the first liftoff layer LOL1, a developing agent may be easily penetrated into the first liftoff layer LOL1.

The first photoresist PR1 may be formed on the first liftoff layer LOL1. A portion of the first photoresist PR1 at a position corresponding to the first pixel electrode 101 may be exposed through a first photomask M1 including a light transmitting portion M11 and a light blocking portion M12.

Figure 6B:
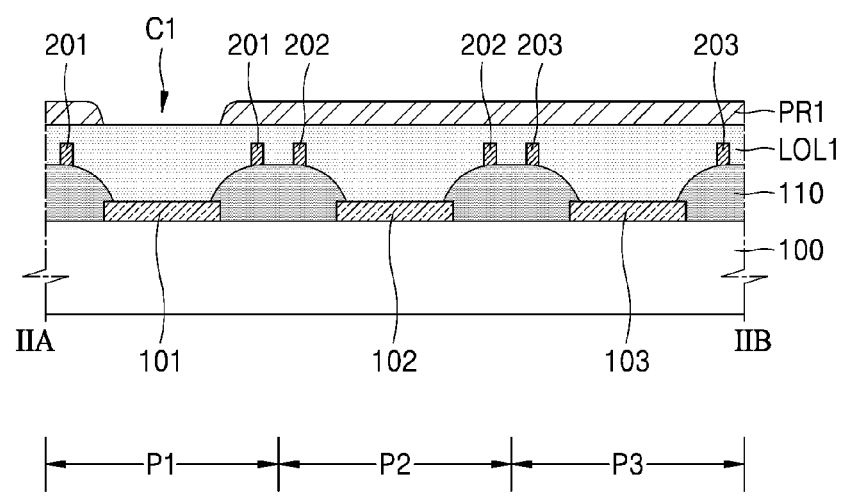

Referring to FIG. 6B, the first photoresist PR1 is developed. The first photoresist PR1 may be a positive photoresist or a negative photoresist. For convenience, the first photoresist PR1 may be described hereinafter in the context of a positive photoresist as a representative example, but the present disclosure is not limited thereto, and the first photoresist PR1 may be a negative photoresist in other examples. The developed first photoresist PR1 has a first opening C1 at a position corresponding to the first pixel electrode 101.

Figure 6C:
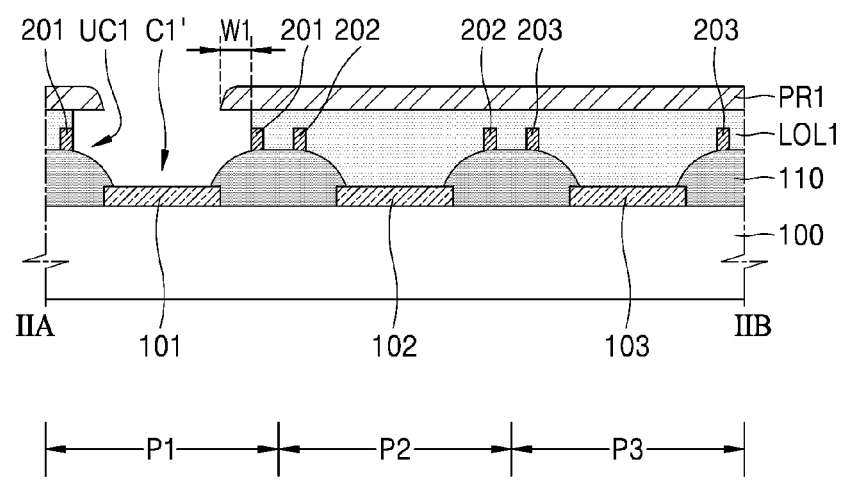

Referring to FIG. 6C, the first liftoff layer LOL1 may be etched by using the first photoresist PR1 of FIG. 6B as an etch mask.

In some embodiments, when the first liftoff layer LOL1 includes a fluoropolymer, a first solvent capable of etching the fluoropolymer may be used as an etching solution. In this case, the first solvent may include, for example, hydrofluoroether. For example, hydrofluoroether may be an electrochemically stable material due to its low interaction with other materials, and may be an environmentally stable material due to its low global warming potential and toxicity.

In other embodiments, when the first liftoff layer LOL1 includes a non-fluorinated material, a solvent having a high reactivity to the first lift-off layer LOL1 may be selected as the first solvent. In this case, the solvent may further have a low reactivity to a material for forming the first intermediate layer 301, a material for forming the first counter electrode 401, and a material for forming the first passivation layer 501.

During an etching process, a first undercut UC1 may be formed so that an edge of the first photoresist PR1 at (e.g., in or on) the first opening C1 protrudes by a first length W1 (e.g., towards the first opening C1) from an edge of the first liftoff layer LOL1.

The first undercut UC1 may be formed in the first liftoff layer LOL1 to form a first deposition space C1' through which a top surface of the first pixel electrode 101 and a portion (e.g., a part) of the pixel-defining film 110 are exposed. Because the first undercut UC1 is formed, the first deposition space C1' that may be wider than that of a structure in which no first undercut UC1 is formed may be secured over the first pixel electrode 101.

In order to realize a desired deposition pattern, it may be desired to minimize or reduce a variation of an undercut length of a liftoff layer that determines a deposition space. An undercut length of a liftoff layer may vary according to a developing agent contact time of the liftoff layer, a pattern density of the sub-pixels, and/or the like. For example, when an undercut length is too small, interference may occur between a deposition pattern and a liftoff layer, and thus, a deposition space may be non-uniform. On the other hand, when an undercut length is too large, a photoresist layer may sag and a deposition space may be non-uniform.

According to one or more embodiments of the present disclosure, the first bank 201 may be formed between the pixel-defining film 110 and the first liftoff layer LOL1 to surround a suitable area (e.g., a predetermined area or a certain area) around (e.g., at least a portion of a periphery of) the first pixel electrode 101, and thus, an etched portion of the first liftoff layer LOL1 may not exceed the first bank 201. In other words, a range of the first deposition space C1' may not exceed the first bank 201, and thus, lengths of the first undercuts UC1 may be uniform or substantially uniform. For example, a dispersion of lengths of the first undercuts UC1 formed at (e.g., in or on) the plurality of first sub-pixels P1 may be reduced, and thus, a range of the first deposition space C1' may be uniformly adjusted.

Figure 6D:
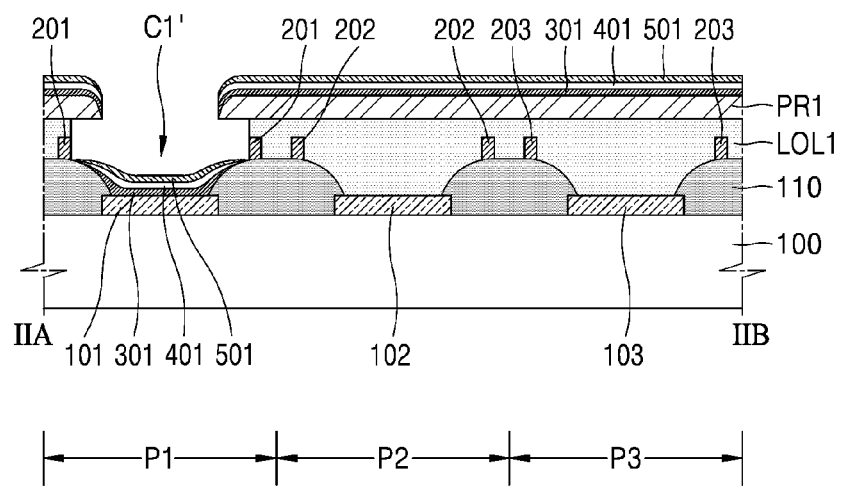

Referring to FIG. 6D, the first intermediate layer 301 including the first emission layer, the first counter electrode 401, and the first passivation layer 501 are formed on a resultant structure of FIG. 6C.

In some embodiments, the first intermediate layer 301 and the first counter electrode 401 may be formed by using vacuum deposition. For example, the first intermediate layer 301 and the first counter electrode 401 may be deposited by using PVD. In an embodiment, the first intermediate layer 301 may be deposited by using one of spluttering, thermal evaporation, electron-beam evaporation, laser molecular beam epitaxy, and pulsed laser deposition. The first counter electrode 401 may be formed to cover the first intermediate layer 301 by adjusting a deposition angle of incidence, a chamber pressure, a temperature, a reactive gas, and/or the like.

Because the first liftoff layer LOL1 and the first photoresist PR1 may function as deposition masks, the first intermediate layer 301 and the first counter electrode 401 may be deposited on a top surface of the first pixel electrode 101 and a part (e.g., a portion) of a top surface of the pixel-defining film 110 within (e.g., inside) the first deposition space C1'. In some embodiments, the first intermediate layer 301 and the first counter electrode 401 (e.g., the materials used to form thereof) may be further deposited on the first photoresist PR1 outside of the first deposition space C1'.

The first intermediate layer 301 may further include at least one of a first hole injection layer, a first hole transport layer, a first electron transport layer, and a first electron injection layer, in addition to the first emission layer.

Because the first counter electrode 401 may be formed to cover the first intermediate layer 301, the first counter electrode 401 may function as a protective film for protecting the first intermediate layer 301, which may be vulnerable to moisture and/or oxygen.

The first passivation layer 501 may be formed to completely cover (e.g., entirely cover) a top surface and an end portion of the first counter electrode 401. The first passivation layer 501 may be deposited by using CVD or ALD having better step coverage than PVD. In an embodiment, the first passivation layer 501 may be deposited by using one of thermal CVD, plasma CVD, metal-organic CVD (MOCVD), and hydride vapor phase epitaxy (HYPE).

As a result of the CVD or ALD, the first passivation layer 501 may be deposited to completely cover (e.g., to entirely cover) a top surface and an end portion of the first counter electrode 401 within (e.g., inside) the first deposition space C1', and may be further deposited on a top surface of a portion of the first counter electrode 401 (e.g., the material or materials used to form thereof) located on the first photoresist PR1 outside the first deposition space C1'.

In some embodiments, the first bank 201 may surround (e.g., around a periphery of) the first passivation layer 501 in a closed loop shape as shown in FIG. 2, to uniformly adjust lengths of the first undercuts UC1 of the first liftoff layer LOL1 and to stably secure the first deposition space C1'. In other embodiments, the first bank 201 may be formed to have the plurality of first open portions OP1 as shown in FIG. 4, to allow a developing agent to be smoothly penetrated into the first liftoff layer LOL1 during a liftoff process and to cleanly remove a residue of the first liftoff layer LOL1.

Because the first passivation layer 501 may be formed by using a deposition method having a suitable step coverage (e.g., a good step coverage) according to one or more embodiments, the first passivation layer 501 may completely cover (e.g., may entirely cover) the first counter electrode 401, and may prevent or substantially prevent damage to the first counter electrode 401 during a liftoff process that may be a subsequent wet process. Further, because the first passivation layer 501 completely covers (e.g., entirely covers) the first intermediate layer 301 as well, degradation of the first intermediate layer 301, which may be vulnerable to moisture and/or oxygen, may be prevented or substantially prevented.

Figure 6E:
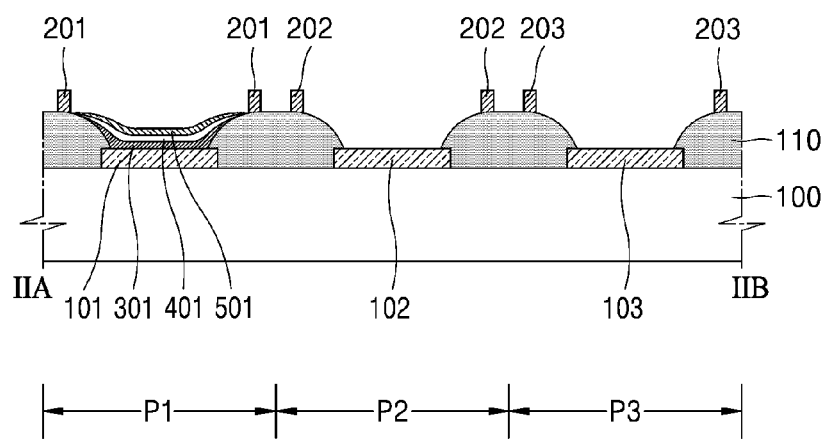

Referring to FIG. 6E, a liftoff process of removing the first liftoff layer LOL1 and the first photoresist PR1 may be performed on a resultant structure of FIG. 6D. For example, in some embodiments, the liftoff process may be performed in a room-temperature atmosphere.

When the first liftoff layer LOL1 includes a fluoropolymer, the first liftoff layer LOL1 may be removed by using a second solvent including, for example, fluorine. In some embodiments, the second solvent may include a material having a low reactivity to the first intermediate layer 301. For example, in some embodiments, the second solvent may include hydrofluoroether, similar to or the same as the first solvent.

When the first liftoff layer LOL1 is formed of a non-fluorinated material, a solvent having a low reactivity to a material used for forming the first intermediate layer 301 and a material used for forming the first counter electrode 401, and having a high reactivity to the first liftoff layer LOL1, may be selected as the second solvent.

As a result of the liftoff process, the first intermediate layer 301, the first counter electrode 401, and the first passivation layer 501 located on the first pixel electrode 101 may remain as patterns.

A second unit process will now be described in more detail. In the following description of the second unit process, redundant description as that of the first unit process may be simplified or may not be repeated.

Figure 7A:
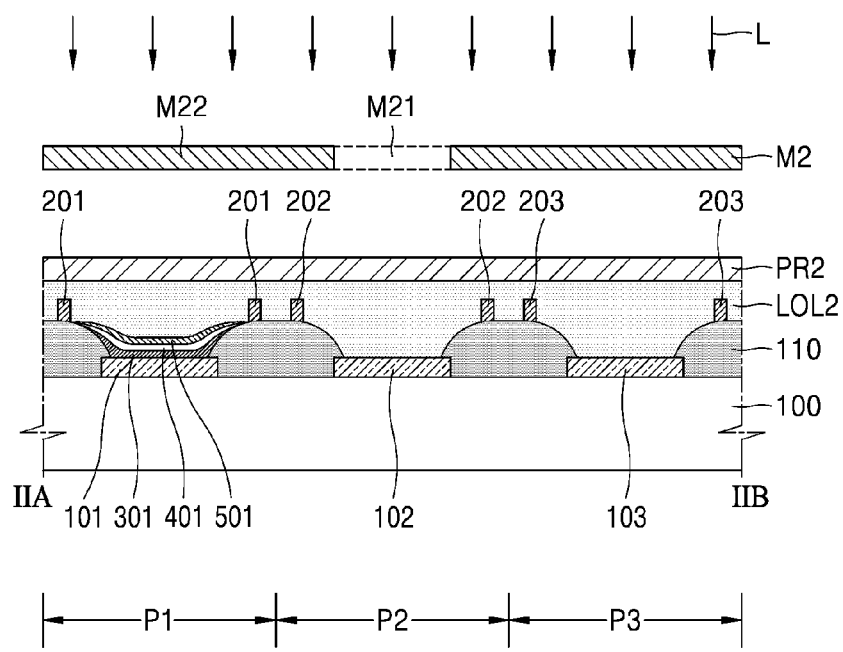
FIGS. 7A-7E are cross-sectional views illustrating a second unit process of the method of manufacturing the organic light-emitting display apparatus.

Referring to FIG. 7A, a second liftoff layer LOL2 and a second photoresist PR2 may be sequentially formed on a resultant structure of FIG. 6E.

The second liftoff layer LOL2 may include the same or substantially the same material as that of the first liftoff layer LOL1. The second liftoff layer LOL2 may be formed by using a coating process, a printing process, a deposition process, and/or the like.

The second liftoff layer LOL2 may be formed to have a height (e.g., in a thickness direction) greater than that of the first through third banks 201, 202, and 203, and thus, during a process of removing the second liftoff layer LOL2, a developing agent may be penetrated (e.g., may be easily penetrated) into the second liftoff layer LOL2.

The second photoresist PR2 may be formed on the second liftoff layer LOL2. A portion of the second photoresist PR2 at a position corresponding to the second pixel electrode 102 may be exposed through a second photomask M2 including a light transmitting portion M21 and a light blocking portion M22.

Figure 7B:
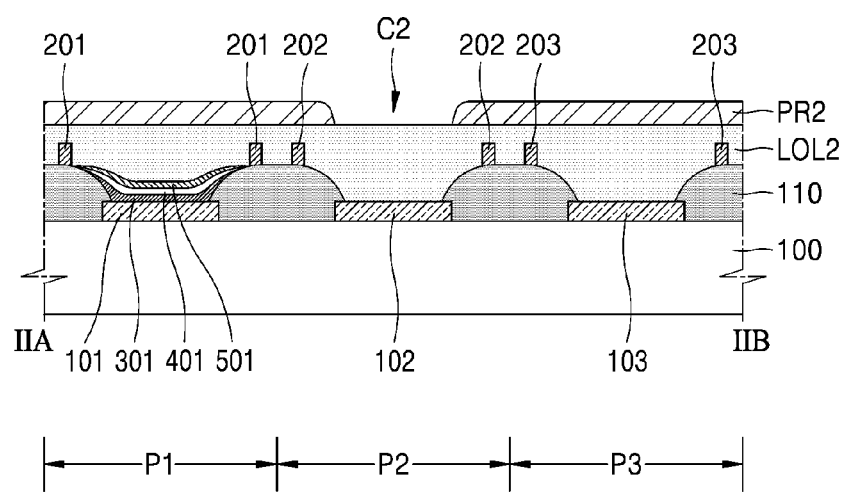

Referring to FIG. 7B, the second photoresist PR2 is developed. The developed second photoresist PR2 may have a second opening C2 at a position corresponding to the second pixel electrode 102.

Figure 7C:
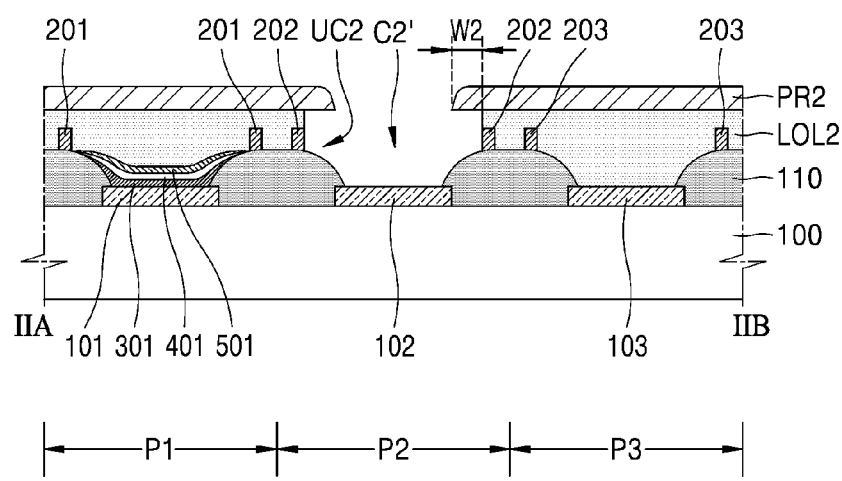

Referring to FIG. 7C, the second liftoff layer LOL2 is etched by using the resultant second photoresist PR2 of FIG. 7B as an etch mask.

When the second liftoff layer LOL2 includes a fluoropolymer, a first solvent capable of etching the fluoropolymer is used as an etching solution. The first solvent may include, for example, hydrofluoroether.

During an etching process, a second undercut UC2 may be formed so that an edge of the second photoresist PR2 at (e.g., in or on) the second opening C2 protrudes by a second length W2 (e.g., towards the second opening C2) from an edge of the second liftoff layer LOL2.

The second undercut UC2 may be formed in the second liftoff layer LOL2 to form a second deposition space C2' through which a top surface of the second pixel electrode 102 and a part (e.g., a portion) of the pixel-defining film 110 are exposed. Because the second undercut UC2 is formed, the second deposition space C2' that may be wider than that of a structure in which no second undercut UC2 is formed may be secured over the second pixel electrode 102.

In one or more example embodiments, the second bank 202 may be formed between the pixel-defining film 110 and the second liftoff layer LOL2 to surround a suitable area (e.g., a predetermined area or a certain area) around (e.g., at least a portion of a periphery of) the second pixel electrode 102, and thus, an etched portion of the second liftoff layer LOL2 may not exceed the second bank 202. In other words, a range of the second deposition space C2' may not exceed the second bank 202, and thus, lengths of the second undercuts UC2 may be uniform or substantially uniform. For example, a dispersion of lengths of the second undercuts UC2 formed at (e.g., in or on) the plurality of second sub-pixels P2 may be reduced, and thus, a range of the second deposition space C2' may be uniformly adjusted.

Figure 7D:
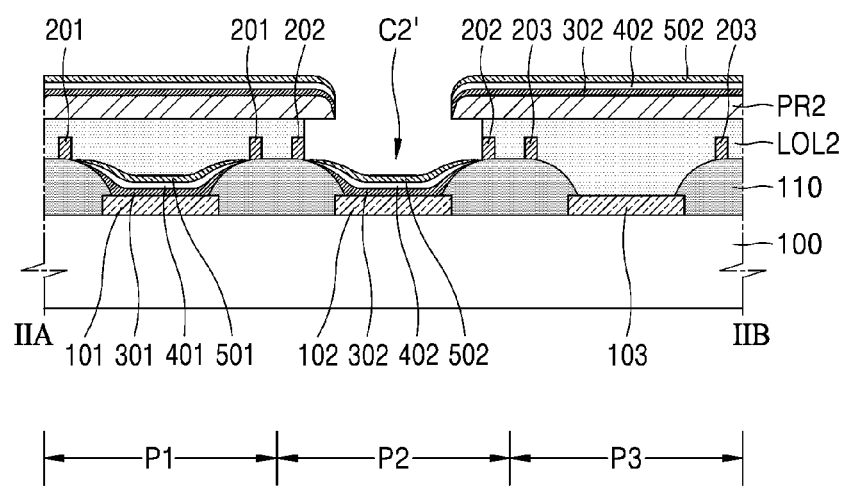

Referring to FIG. 7D, the second intermediate layer including the second emission layer, the second counter electrode 402, and the second passivation layer 502 may be formed on a resultant structure of FIG. 7C.

The second intermediate layer 302 and the second counter electrode 402 may be formed by using, for example, vacuum deposition. For example, the second intermediate layer 302 and the second counter electrode 402 may be deposited by using PVD.

Because the second liftoff layer LOL2 and the second photoresist PR2 may function as deposition masks, the second intermediate layer 302 and the second counter electrode 402 may be deposited on a top surface of the second pixel electrode 102 and a part (e.g., a portion) of a top surface of the pixel-defining film 110 within (e.g., inside) the second deposition space C2'. In some embodiments, the second intermediate layer 302 and the second counter electrode 402 (e.g., the materials used to form thereof) may be further deposited on the second photoresist PR2 outside of the second deposition space C2'.

The second intermediate layer 302 may further include at least one of a second hole injection layer, a second hole transport layer, a second electron transport layer, and a second electron injection layer, in addition to the second emission layer. The second emission layer may include a material that emits light of a color that is different from that of the first emission layer. The second hole injection layer, the second hole transport layer, the second electron transport layer, and the second electron injection layer may include the same or substantially the same materials as those of the first hole injection layer, the first hole transport layer, the first electron transport layer, and the first electron injection layer, respectively. In some embodiments, the second intermediate layer 302 may include more layers or fewer layers than that of the first intermediate layer 301, and/or may be formed by differently adjusting a thickness of each layer.

Because the second counter electrode 402 may be formed to cover the second intermediate layer 302, the second counter electrode 402 may function as a protective film for protecting the second intermediate layer 302, which may be vulnerable to moisture and/or oxygen.

The second passivation layer 502 may be formed to completely cover (e.g., to entirely cover) a top surface and an end portion of the second counter electrode 402. The second passivation layer 502 may be deposited by using, for example, CVD or ALD having better step coverage than PVD.

As a result of CVD or ALD, the second passivation layer 502 may be deposited to completely cover (e.g., to entirely cover) a top surface and an end portion of the second counter electrode 402 within (e.g., inside) the second deposition space C2', and may be deposited on a top surface of a portion of the second counter electrode 402 (e.g., the material or materials used to form thereof) located on the second photoresist PR2 outside of the second deposition space C2'.

In some embodiments, the second bank 202 may surround (e.g., around a periphery of) the second passivation layer 502 in a closed loop shape as shown in FIG. 2, to uniformly adjust lengths of the second undercuts UC2 of the second liftoff layer LOL2 and to stably secure the second deposition space C2'. In other embodiments, the second bank 202 may be formed to have the plurality of second open portions OP2 as shown in FIG. 4, to allow a developing agent to be smoothly penetrated into the second liftoff layer LOL2 during a liftoff process and to cleanly remove a residue of the second liftoff layer LOL2.

Because the second passivation layer 502 may be formed by using a deposition method having a suitable step coverage (e.g., a good step coverage) according to one or more embodiments, the second passivation layer 502 may completely cover (e.g., may entirely cover) the second counter electrode 402, and may prevent or substantially prevent damage to the second counter electrode 402 during a liftoff process that may be a subsequent wet process. Further, because the second passivation layer 502 may completely cover (e.g., may entirely cover) the second intermediate layer 302 as well, degradation of the second intermediate layer 302, which may be vulnerable to moisture and/or oxygen, may be prevented or substantially prevented.

Figure 7E:
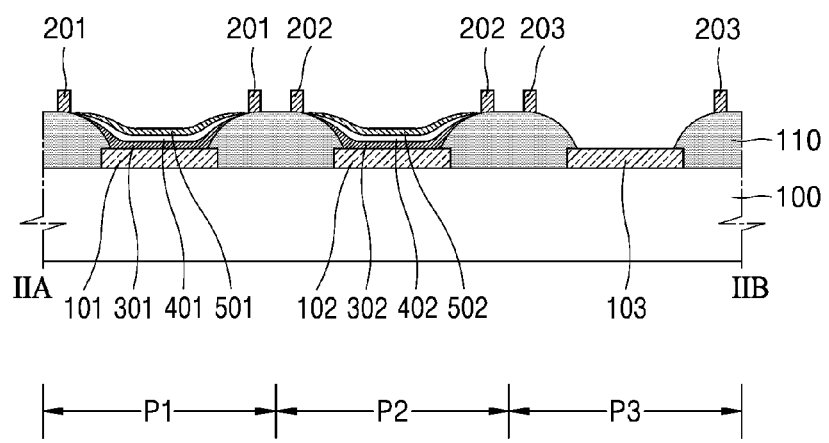

Referring to FIG. 7E, a liftoff process of removing the second liftoff layer LOL2 and the second photoresist PR2 is performed on a resultant structure of FIG. 7D. In some embodiments, the liftoff process may be performed in a room-temperature atmosphere.

When the second liftoff layer LOL2 includes a fluoropolymer, the second liftoff layer LOL2 may be removed by using a second solvent including, for example, fluorine. When the second liftoff layer LOL2 is formed of a non-fluorinated material, a solvent having a low reactivity to a material used for forming the second intermediate layer 302 and a material used for forming the second counter electrode 402, and having a high reactivity to the second liftoff layer LOL2, may be selected as the second solvent.

As a result of the liftoff process, the second intermediate layer 302, the second counter electrode 402, and the second passivation layer 502 located on the second pixel electrode 102 may remain as patterns.

A third unit process will now be described in more detail. In the following description of the third unit process, redundant description as those of the first and second unit processes may be simplified or may not be repeated.

Figure 8A:
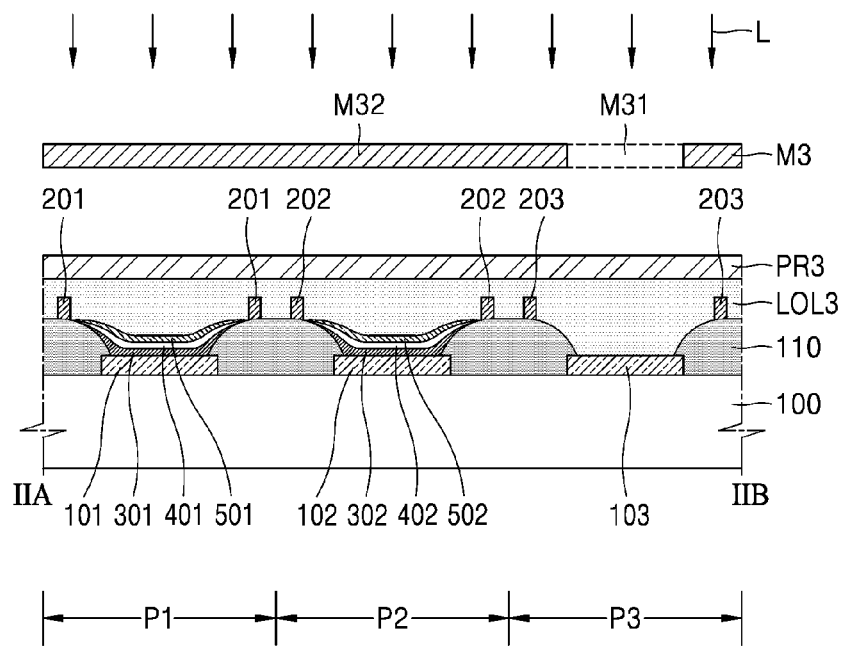
FIGS. 8A-8E are cross-sectional views illustrating a third unit process of the method of manufacturing the organic light-emitting display apparatus.

Referring to FIG. 8A, a third liftoff layer LOL3 and a third photoresist PR3 may be sequentially formed on a resultant structure of FIG. 7E.

The third liftoff layer LOL3 may include the same or substantially the same material as that of the first liftoff layer LOL1 and/or as that of the second liftoff layer LOL2. The third liftoff layer LOL3 may be formed by using a coating process, a printing process, a deposition process, and/or the like.

The third liftoff layer LOL3 may be formed to have a height (e.g., in a thickness direction) greater than that of the first through third banks 201, 202, and 203, and thus, during a process of removing the third liftoff layer LOL3, a developing agent may be smoothly penetrated into the third liftoff layer LOL3.

The third photoresist PR3 may be formed on the third liftoff layer LOL3. A portion of the third photoresist PR3 at a position corresponding to the third pixel electrode 103 may be exposed through a third photomask M3 including a light transmitting portion M31 and a light blocking portion M32.

Figure 8B:
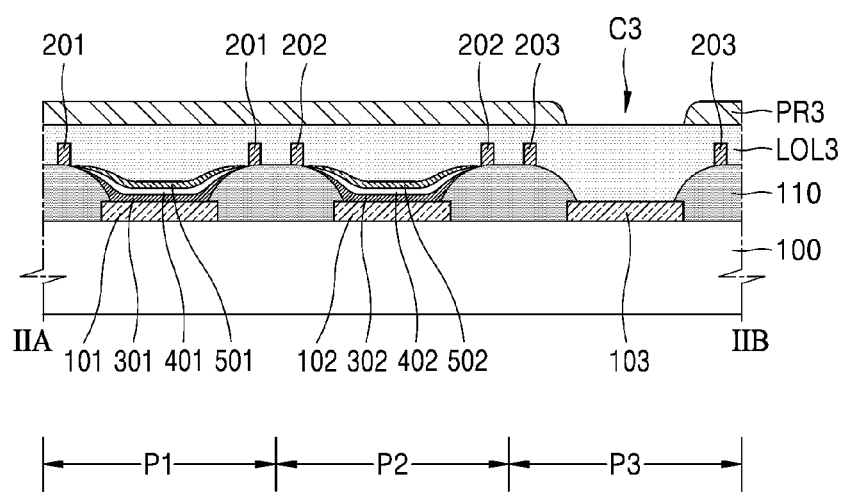

Referring to FIG. 8B, the third photoresist PR3 is developed. The developed third photoresist PR3 may have a third opening C3 at a position corresponding to the third pixel electrode 103.

Figure 8C:
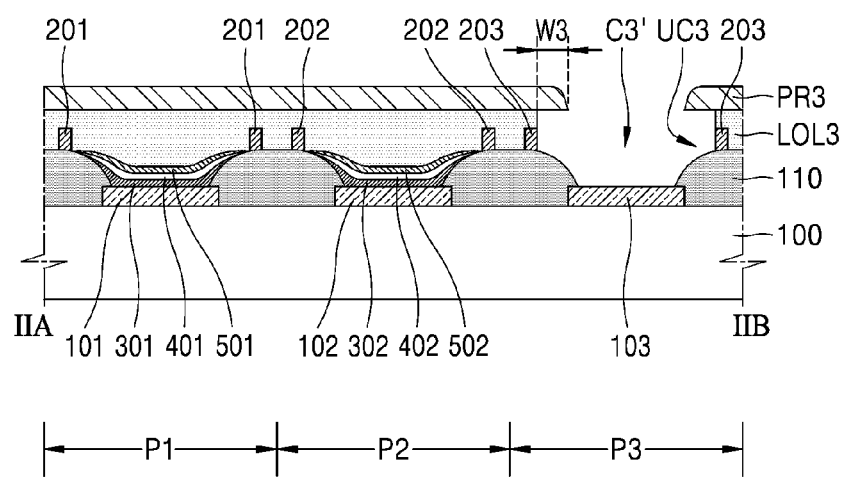

Referring to FIG. 8C, the third liftoff layer LOL3 is etched, for example, by using the resultant third photoresist PR3 of FIG. 8B as an etch mask.

When the third liftoff layer LOL3 includes a fluoropolymer, a first solvent capable of etching the fluoropolymer may be used as an etching solution. The first solvent may include, for example, hydrofluoroether.

During an etching process, a third undercut UC3 may be formed so that an edge of the third photoresist PR3 at (e.g., in or on) the third opening C3 protrudes by a third length W3 (e.g., towards the third opening C3) from an edge of the third liftoff layer LOL3.

The third undercut UC3 may be formed in the third liftoff layer LOL3 to form a third deposition space C3' through which a top surface of the third pixel electrode 103 and a part (e.g., a portion) of the pixel-defining film 110 are exposed. Because the third undercut UC3 may be formed, the third deposition space C3' that may be wider than that of a structure in which no third undercut UC3 is formed may be secured over the third pixel electrode 103.

In one or more example embodiments, the third bank 203 may be formed between the pixel-defining film 110 and the third liftoff layer LOL3 to surround a suitable area (e.g., a predetermined area or a certain area) around (e.g., at least a portion of a periphery of) the third pixel electrode 103, and thus, an etched portion of the third liftoff layer LOL3 may not exceed the third bank 203. In other words, a range of the third deposition space C3' may not exceed the third bank 203, and thus, lengths of the third undercuts UC3 may be uniform or substantially uniform. For example, a dispersion of lengths of the third undercuts UC3 formed at (e.g., in or on) the plurality of third sub-pixels P3 may be reduced, and thus, a range of the third deposition space C3' may be uniformly adjusted.

Figure 8D:
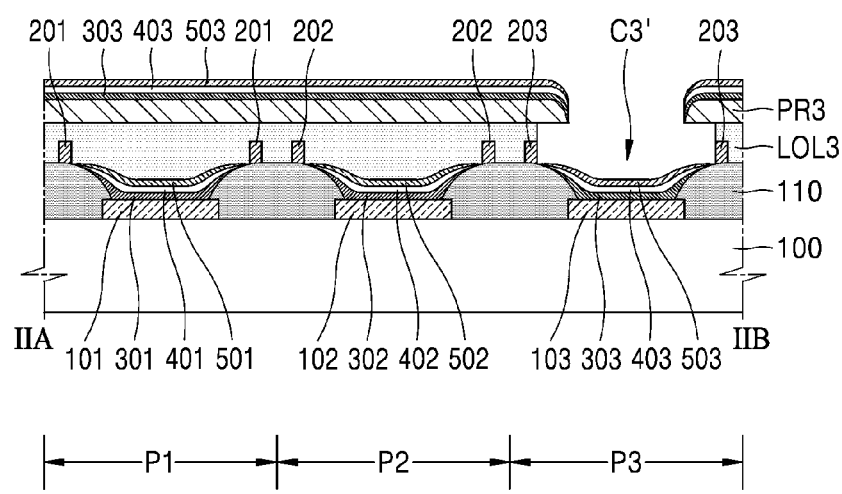

Referring to FIG. 8D, the third intermediate layer 303 including the third emission layer, the third counter electrode 403, and the third passivation layer 503 may be formed on a resultant structure of FIG. 8C.

The third intermediate layer 303 and the third counter electrode 403 may be formed by using, for example, vacuum deposition. For example, the third intermediate layer 303 and the third counter electrode 403 may be deposited by using PVD.

Because the third liftoff layer LOL3 and the third photoresist PR3 may function as deposition masks, the third intermediate layer 303 and the third counter electrode 403 may be deposited on a top surface of the third pixel electrode 103 and a part (e.g., a portion) of a top surface of the pixel-defining film 110 within (e.g., inside) the third deposition space C3'. In some embodiments, the third intermediate layer 303 and the third counter electrode 403 (e.g., the materials used to form thereof) may be further deposited on the third photoresist PR3 outside of the third deposition space C3'.

The third intermediate layer 303 may further include at least one of a third hole injection layer, a third hole transport layer, a third electron transport layer, and a third electron injection layer, in addition to the third emission layer.

The third emission layer may include a material that emits light of a color different from those of the first emission layer and the second emission layer. Light emitted by the first through third emission layers may be combined into white light. For example, the first emission layer may emit red light, the second emission layer may emit green light, and the third emission layer may emit blue light.

The third hole injection layer, the third hole transport layer, the third electron transport layer, and the third electron injection layer may include the same or substantially the same materials as those of the first and second hole injection layers, the first and second hole transport layers, the first and second electron transport layers, and the first and second electron injection layers, respectively. In some embodiments, the third intermediate layer 303 may include more layers or fewer layers than those of the first intermediate layer 301 and the second intermediate layer 302, and may be formed by differently adjusting a thickness of each layer.

Because the third counter electrode 403 may be formed to cover the third intermediate layer 303, the third counter electrode 403 may function as a protective film for protecting or substantially protecting the third intermediate layer 303, which may be vulnerable to moisture and/or oxygen.

The third passivation layer 503 may be formed to completely cover (e.g., to entirely cover) a top surface and an end portion of the third counter electrode 403. The third passivation layer 503 may be deposited by using CVD or ALD having better step coverage than PVD.

As a result of CVD or ALD, the third passivation layer 503 may be deposited to completely cover (e.g., to entirely cover) a top surface and an end portion of the third counter electrode 403 within (e.g., inside) the third deposition space C3', and may be deposited on a top surface of a portion of the third counter electrode 403 (e.g., one or more materials used to form thereof) located on the third photoresist PR3 outside of the third deposition space C3'.

In some embodiments, the third bank 203 may surround (e.g., around a periphery of) the third passivation layer 503 in a closed loop shape as shown in FIG. 2, to uniformly adjust lengths of the third undercuts UC3 of the third liftoff layer LOL3 and to stably secure the third deposition space C3'. In other embodiments, the third bank 203 may be formed to have the plurality of third open portions OP3 as shown in FIG. 4, to allow a developing agent to be smoothly penetrated into the third liftoff layer LOL3 during a liftoff process, and to cleanly remove a residue of the third liftoff layer LOL3.

Because the third passivation layer 503 may be formed by using a deposition method having a suitable step coverage (e.g., a good step coverage) according to one or more example embodiments, the third passivation layer 503 may completely cover (e.g., may entirely cover) the third counter electrode 403, and may prevent or substantially prevent damage to the third counter electrode 403 during a liftoff process that may be a subsequent wet process. Further, because the third passivation layer 503 may completely cover (e.g., may entirely cover) the third intermediate layer 303 as well, degradation of the third intermediate layer 303, which may be vulnerable to moisture and/or oxygen, may be prevented or substantially prevented.

Figure 8E:
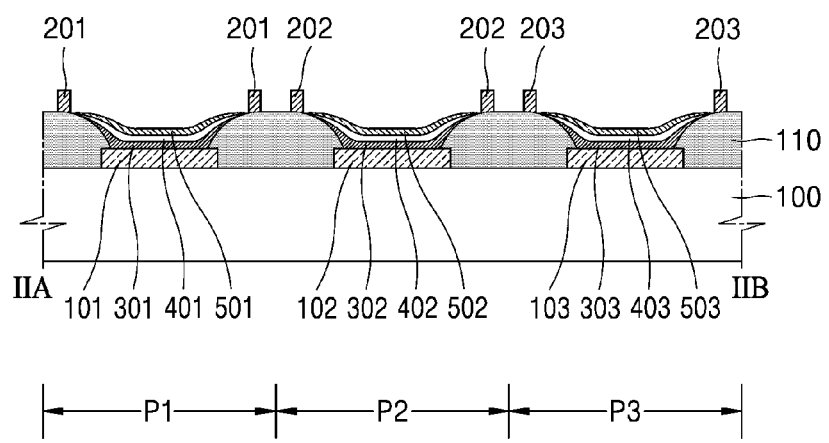

Referring to FIG. 8E, a liftoff process of removing the third liftoff layer LOL3 and the third photoresist PR3 is performed on a resultant structure of FIG. 8D. In some embodiments, the liftoff process may be performed in a room-temperature atmosphere.

When the third liftoff layer LOL3 includes a fluoropolymer, the third liftoff layer LOL3 may be removed by using a third solvent including, for example, fluorine. When the third liftoff layer LOL3 is formed of a non-fluorinated material, a solvent having a low reactivity to a material used for forming the third intermediate layer 303 and a material used for forming the third counter electrode 403, and a high reactivity to the third liftoff layer LOL3, may be selected as the third solvent.

As a result of the liftoff process, the third intermediate layer 303, the third counter electrode 403, and the third passivation layer 503 located on the third pixel electrode 103 may remain as patterns.

After the first through third unit processes are performed, the encapsulation member 700 (e.g., see FIG. 3), which may cover all of the top surfaces of the first through third passivation layers 501, 502, and 503, may be formed.

The encapsulation member 700 may include at least one organic layer and at least one inorganic layer. For example, as shown in FIG. 3, the encapsulation member 700 may include the first inorganic layer 701, the organic layer 702, and the second inorganic layer 703 that are sequentially stacked on one another. The encapsulation member 700 may prevent or substantially prevent damage to the organic light-emitting device, which may be vulnerable to moisture, along with the first through third passivation layers 501, 502, and 503, by preventing or substantially preventing the penetration of moisture.

According to a manufacturing method of one or more example embodiments of the present disclosure, because an intermediate layer including an emission layer may be formed by using a liftoff process instead of being deposited by using an FMM, misalignment of the FMM may be prevented and/or manufacturing costs may be reduced. In addition, because a passivation layer may be formed by using a vapor deposition method having a suitable step coverage (e.g., an excellent step coverage), a counter electrode may be completely covered (e.g., may be entirely covered) to reduce defects of an organic light-emitting device. Further, because banks located outside the passivation layer may protrude in a direction away from a substrate, a dispersion of lengths of undercuts of a liftoff layer may be reduced, and thus, a precise pixel design may be provided.

According to one or more example embodiments, because an intermediate layer including an emission layer may be formed by using a liftoff process instead of being deposited by using an FMM, misalignment of the FMM may be prevented and/or manufacturing costs may be reduced.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. An organic light-emitting display apparatus comprising:
    a substrate;
    first and second pixel electrodes on the substrate, and spaced from each other;
    a pixel-defining film surrounding edges of the first and second pixel electrodes;
    a first intermediate layer on the first pixel electrode, and comprising a first emission layer;
    a second intermediate layer on the second pixel electrode to be spaced from the first intermediate layer, and comprising a second emission layer;
    a first counter electrode on the first intermediate layer;
    a second counter electrode on the second intermediate layer to be spaced from the first counter electrode;
    a first passivation layer on the first counter electrode;
    a second passivation layer on the second counter electrode to be spaced from the first passivation layer;
    a first bank around the first passivation layer and protruding from the pixel-defining film to extend in a direction away from the substrate; and
    a second bank around the second passivation layer and protruding from the pixel-defining film to extend in the direction away from the substrate.

2. The organic light-emitting display apparatus of claim 1, wherein each of the first bank and the second bank has a closed loop shape.

3. The organic light-emitting display apparatus of claim 1, wherein each of the first bank and the second bank comprises a plurality of open portions.

4. The organic light-emitting display apparatus of claim 1, wherein an area of the first passivation layer is greater than an area of the first counter electrode, and
    an area of the second passivation layer is greater than an area of the second counter electrode.

5. The organic light-emitting display apparatus of claim 4, wherein the first passivation layer covers both a top surface and a side surface of the first counter electrode, and
    the second passivation layer covers both a top surface and a side surface of the second counter electrode.

6. The organic light-emitting display apparatus of claim 1, wherein an area of the first counter electrode is greater than an area of the first intermediate layer, and
    an area of the second counter electrode is greater than an area of the second intermediate layer.

7. The organic light-emitting display apparatus of claim 6, wherein the first counter electrode covers both a top surface and a side surface of the first intermediate layer, and
    the second counter electrode covers both a top surface and a side surface of the second intermediate layer.

8. The organic light-emitting display apparatus of claim 1, wherein each of the first and second banks comprises a same material as a material of the pixel-defining film.

9. The organic light-emitting display apparatus of claim 1, wherein a bottom surface of each of the first and second banks directly contacts a top surface of the pixel-defining film.

10. The organic light-emitting display apparatus of claim 1, further comprising an encapsulation member covering the first and second passivation layers and the first and second banks.

11. The organic light-emitting display apparatus of claim 10, wherein the encapsulation member comprises at least one organic layer comprising an organic material, and at least one inorganic layer comprising an inorganic material.

12. The organic light-emitting display apparatus of claim 11, wherein the at least one inorganic layer comprises a first inorganic layer directly contacting the first and second passivation layers, and a second inorganic layer on the at least one organic layer.

13. The organic light-emitting display apparatus of claim 1, wherein the first emission layer and the second emission layer emit light of different colors from each other.

14. The organic light-emitting display apparatus of claim 1, wherein each of the first intermediate layer and the second intermediate layer further comprises at least one layer selected from among a hole injection layer, a hole transport layer, an electron transport layer, and an electron injection layer.

15. The organic light-emitting display apparatus of claim 1, wherein each of the first and second passivation layers comprises a nitride-based inorganic material.

* * * * *